(12) United States Patent
Tsuda et al.

(10) Patent No.: US 12,101,110 B2
(45) Date of Patent: Sep. 24, 2024

(54) RADIO FREQUENCY MODULE AND COMMUNICATION DEVICE

(71) Applicant: Murata Manufacturing Co., Ltd., Kyoto (JP)

(72) Inventors: Motoji Tsuda, Kyoto (JP); Hayato Nakamura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 35 days.

(21) Appl. No.: 18/187,994

(22) Filed: Mar. 22, 2023

(65) Prior Publication Data

US 2023/0231582 A1 Jul. 20, 2023

Related U.S. Application Data

(63) Continuation of application No. PCT/JP2021/038369, filed on Oct. 18, 2021.

(30) Foreign Application Priority Data

Oct. 28, 2020 (JP) ................................ 2020-180890

(51) Int. Cl.
*H04B 1/04* (2006.01)
*H03F 3/24* (2006.01)

(52) U.S. Cl.
CPC .............. *H04B 1/04* (2013.01); *H03F 3/245* (2013.01); *H03F 2200/451* (2013.01); *H04B 2001/0408* (2013.01)

(58) Field of Classification Search
CPC .............. H03G 3/3042; H03G 3/3047; H03G 2201/708; H03G 2201/103;
(Continued)

(56) References Cited

U.S. PATENT DOCUMENTS

2006/0030359 A1* 2/2006 Behzad .................. H04B 1/036
455/556.1
2009/0072900 A1* 3/2009 Park ...................... H03F 1/3282
370/294
(Continued)

FOREIGN PATENT DOCUMENTS

JP S58-87923 A 5/1983
JP 2005-080228 A 3/2005
(Continued)

OTHER PUBLICATIONS

International Search Report for PCT/JP2021/038369 dated Jan. 11, 2022.

*Primary Examiner* — Eva Y Puente
(74) *Attorney, Agent, or Firm* — Pearne & Gordon LLP

(57) ABSTRACT

A radio frequency module includes a module substrate; a power amplifier disposed on or over the module substrate, amplifies a radio frequency signal, and outputs the amplified radio frequency signal as the first transmission signal; a power amplifier disposed on or over the module substrate, amplifies a radio frequency signal, and outputs the amplified radio frequency signal as the second transmission signal; a temperature sensor disposed on or over the module substrate; and a PA control circuit disposed on or over the module substrate and controls amplification operations of the power amplifiers according to a measurement value of the temperature sensor. The maximum output power of the power amplifier is greater than the maximum output power of the power amplifier, and the distance between the temperature sensor and the power amplifier is less than or equal to the distance between the temperature sensor and the power amplifier.

20 Claims, 6 Drawing Sheets

(58) Field of Classification Search
CPC ........... H03G 2201/307; H03G 3/3036; H03G
3/001; H04B 1/04; H04B 1/40; H04B
1/036; H04B 1/0475; H04B 2001/0408;
H04B 2001/0416; H04B 1/30; H04B
2001/0425; H03F 2200/447; H03F
2200/451; H03F 1/30; H03F 2200/468;
H03F 3/24; H03F 3/245; H03F 1/52;
H03F 3/19
USPC ........................................................ 375/297
See application file for complete search history.

(56) References Cited

U.S. PATENT DOCUMENTS

| | | | |
|---|---|---|---|
| 2012/0264383 A1 | 10/2012 | Kondo | |
| 2013/0163482 A1* | 6/2013 | Suzuki | H04L 5/1461 |
| | | | 370/278 |
| 2018/0115287 A1* | 4/2018 | Rabjohn | H03F 1/02 |
| 2021/0067191 A1* | 3/2021 | Choi | H04B 1/04 |

FOREIGN PATENT DOCUMENTS

| | | |
|---|---|---|
| JP | 2012-222702 A | 11/2012 |
| JP | 2018-137522 A | 8/2018 |
| JP | 2020-057992 A | 4/2020 |

* cited by examiner

RADIO FREQUENCY MODULE AND COMMUNICATION DEVICE

CROSS REFERENCE TO RELATED APPLICATION

This is a continuation of International Application No. PCT/JP2021/038369 filed on Oct. 18, 2021 which claims priority from Japanese Patent Application No. 2020-180890 filed on Oct. 28, 2020. The contents of these applications are incorporated herein by reference in their entireties.

BACKGROUND ART

Technical Field

The present disclosure relates to a radio frequency module and a communication device.

A mobile communication device, such as a mobile phone, includes a power amplifier for amplifying a radio-frequency transmission signal. Patent Document 1 discloses a front-end circuit (radio frequency module) including a PA circuit (transmitter amplifier circuit) that transmits a radio-frequency transmission signal and an LNA circuit (receiver amplifier circuit) that transmits a radio-frequency reception signal. The transmitter amplifier circuit includes a PA control unit that controls the amplification characteristics of a power amplifier, and the receiver amplifier circuit includes an LNA control unit that controls the amplification characteristics of a low-noise amplifier.

Patent Document 1: Japanese Unexamined Patent Application Publication No. 2018-137522

BRIEF SUMMARY

However, when transmission signals with various power levels are transmitted simultaneously from multiple power amplifiers in the radio frequency module disclosed in Patent Document 1, the temperature of the radio frequency module may locally increase due to heat generated by the multiple power amplifiers. This may cause a problem that the temperature of the RF module cannot be measured accurately due to temperature unevenness resulting from the local temperature increase, the temperature of one of the multiple power amplifiers increases more than expected, and the performance of the power amplifiers is degraded.

The present disclosure provides a radio frequency module and a communication device configured such that accurate temperature measurement can be performed even when multiple radio frequency signals are simultaneously transmitted and the performance degradation of power amplifiers can be reduced.

Solution to Problem

A radio frequency module according to an aspect of the present disclosure is capable of simultaneously transmitting a first transmission signal and a second transmission signal and includes a module substrate; a first power amplifier that is disposed on or over the module substrate, amplifies a radio frequency signal, and outputs the amplified radio frequency signal as the first transmission signal; a second power amplifier that is disposed on or over the module substrate, amplifies another radio frequency signal, and outputs the amplified other radio frequency signal as the second transmission signal; a temperature sensor disposed on or over the module substrate; and a control circuit that is disposed on or over the module substrate and controls amplification operations of the first power amplifier and the second power amplifier according to a measurement value of the temperature sensor. The maximum output power of the first power amplifier is greater than the maximum output power of the second power amplifier, and the distance between the temperature sensor and the first power amplifier is less than or equal to the distance between the temperature sensor and the second power amplifier.

The present disclosure makes it possible to provide a radio frequency module and a communication device configured such that accurate temperature measurement can be performed even when multiple radio frequency signals are transmitted simultaneously and the performance degradation of power amplifiers is thereby reduced.

DETAILED DESCRIPTION

Figure 1:
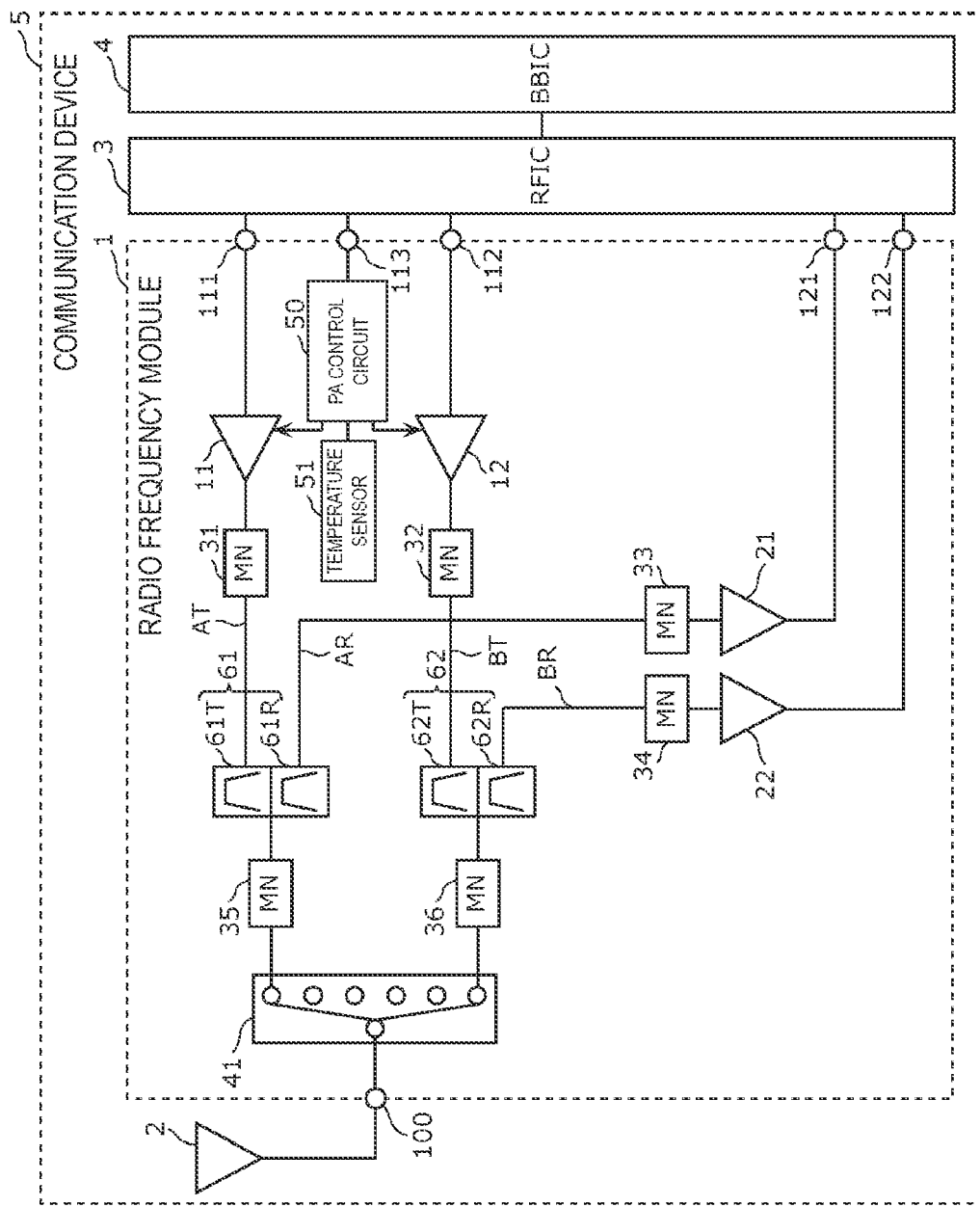
FIG. 1 is a circuit diagram of a radio frequency module and a communication device according to an embodiment.

Embodiments of the present disclosure are described below in detail. Each of the embodiments described below represents a general or specific example. Values, shapes, materials, components, and layouts and connection configurations of the components described in the embodiments below are just examples and are not intended to limit the present disclosure. Among components described in the examples and the variations below, components not recited in independent claims are optional components. Also, the sizes or the ratios of sizes of components illustrated in the drawings are not necessarily accurate. In the drawings, the same reference number is assigned to substantially the same components, and overlapping descriptions of those components are omitted or simplified.

Also, in the descriptions below, terms such as "parallel" and "perpendicular" indicating relationships between elements, terms such as "rectangular" indicating shapes of elements, and numerical ranges do not only indicate their exact meanings but may also indicate substantially the same ranges with a difference of, for example, about a few percent.

In the descriptions below, when A, B, and C are mounted on or over a substrate, "C is disposed between A and B in plan view of the substrate (or the major surface of the substrate)" indicates that at least one of multiple line segments connecting given points in A and given points in B passes through the region of C in plan view of the substrate. Also, plan view of the substrate indicates a view of the substrate and circuit elements mounted on or over the substrate that are orthographically projected onto a plane parallel to the major surface of the substrate.

In the descriptions below, "A is disposed on the first major surface of the substrate" not only indicates that A is directly mounted on the first major surface but also indicates that, out of a space over the first major surface and a space over the second major surface that are separated by the substrate, A is disposed in the space over the first major surface. That is, the above expression includes a case in which A is mounted on the first major surface via other elements such as a circuit element and an electrode.

In the descriptions below, "transmission path" indicates a transmission line that is constituted by, for example, a wire for transmitting a transmission signal, an electrode directly connected to the wire, and a terminal directly connected to the wire or the electrode. Also, "reception path" indicates a transmission line that is constituted by, for example, a wire for transmitting a reception signal, an electrode directly connected to the wire, and a terminal directly connected to the wire or the electrode. Furthermore, "signal path" indicates a transmission line that is constituted by, for example, a wire for transmitting a radio frequency signal, an electrode directly connected to the wire, and a terminal directly connected to the wire or the electrode.

Embodiment

1. Circuit Configurations of Radio Frequency Module 1 and Communication Device 5

FIG. 1 is a circuit diagram of a radio frequency module 1 and a communication device 5 according to an embodiment. As illustrated in FIG. 1, the communication device 5 includes the radio frequency module 1, an antenna 2, an RF signal processing circuit (RFIC) 3, and a base band signal processing circuit (BBIC) 4.

The RFIC 3 is an RF signal processing circuit that processes radio frequency signals sent and received via the antenna 2. Specifically, the RFIC 3 performs signal processing, such as down-converting, on a reception signal input via a reception path of the radio frequency module 1 and outputs a reception signal generated by the signal processing to the BBIC 4. Also, the RFIC 3 performs signal processing, such as up-converting, on a transmission signal input from the BBIC 4 and outputs a transmission signal generated by the signal processing to a transmission path of the radio frequency module 1.

The BBIC 4 performs signal processing by using an intermediate frequency band lower than the frequency of a radio frequency signal transmitted through the radio frequency module 1. For example, a signal processed by the BBIC 4 is used as an image signal for displaying an image or as a voice signal for a call via a speaker.

The RFIC 3 also functions as a control unit that controls the connection of a switch 41 of the radio frequency module 1 based on a communication band (frequency band) being used. Specifically, the RFIC 3 switches the connection of the switch 41 of the radio frequency module 1 according to a control signal (not shown). More specifically, the RFIC 3 outputs a digital control signal for controlling the switch 41 to a PA control circuit 50. The PA control circuit 50 of the radio frequency module 1 controls the connection and disconnection of the switch 41 by outputting a digital control signal to the switch 41 according to the digital control signal input from the RFIC 3. Here, the connection and disconnection of the switch 41 need not necessarily be controlled by the PA control circuit 50 and may be controlled by another control circuit.

The RFIC 3 also functions as a control unit that controls the gains of power amplifiers 11 and 12 of the radio frequency module 1 and controls a power supply voltage Vcc and a bias voltage Vbias supplied to the power amplifiers 11 and 12. Specifically, the RFIC 3 outputs digital control signals, such as MIPI and GPIO, to a control signal terminal 113 of the radio frequency module 1. The PA control circuit 50 of the radio frequency module 1 adjusts the gains of the power amplifiers 11 and 12 by outputting control signals and the power supply voltage Vcc or the bias voltage Vbias to the power amplifiers 11 and 12 according to the digital control signals input via the control signal terminal 113. Here, a control signal terminal that receives, from the RFIC 3, a digital control signal for controlling the gains of the power amplifiers 11 and 12 and a control signal terminal that receives, from the RFIC 3, a digital control signal for controlling the power supply voltage Vcc and the bias voltage Vbias supplied to the power amplifiers 11 and 12 may be different from each other. The control unit may instead be provided outside of the RFIC 3 and may be provided, for example, in the BBIC 4.

The antenna 2 is connected to an antenna connection terminal 100 of the radio frequency module 1, emits a radio frequency signal output from the radio frequency module 1, receives a radio frequency signal from the outside, and outputs the received radio frequency signal to the radio frequency module 1.

In the communication device 5 according to the present embodiment, the antenna 2 and the BBIC 4 are optional components.

Next, a circuit configuration of the radio frequency module 1 is described.

As illustrated in FIG. 1, the radio frequency module 1 includes the antenna connection terminal 100, the power amplifiers 11 and 12, low-noise amplifiers 21 and 22, the PA control circuit 50, a temperature sensor 51, transmission filters 61T and 62T, reception filters 61R and 62R, matching circuits 31, 32, 33, 34, 35, and 36, the switch 41, transmission input terminals 111 and 112, reception output terminals 121 and 122, and the control signal terminal 113.

The antenna connection terminal 100 is an example of an input-output terminal and is an antenna common terminal connected to the antenna 2.

The power amplifier 11 is an example of a first power amplifier, amplifies a radio frequency signal that is in a communication band A and input from the transmission input terminal 111, and outputs the amplified radio frequency signal as a first transmission signal. The power amplifier 12 is an example of a second power amplifier, amplifies a radio frequency signal that is in a communication band B and input from the transmission input terminal 112, and outputs the amplified radio frequency signal as a second transmission signal.

The power amplifier 11 includes, for example, an amplification transistor Tr1 (first amplification transistor element) and a first bias circuit. The amplification transistor Tr1 is, for example, a grounded-emitter bipolar transistor including a collector, an emitter, and a base, amplifies a radio frequency current input to the base, and outputs the amplified radio frequency current from the collector. Also, the amplification transistor Tr1 may instead be a field-effect transistor including a drain, a source, and a gate. The first bias circuit is electrically connected to the base of the amplification transistor Tr1 and includes a function to optimize the operating point of the amplification transistor Tr1 by applying a bias voltage to the base.

With the circuit configuration of the power amplifier 11 described above, a radio frequency signal input from the input terminal becomes a base current Ib that flows from the base to the emitter of the amplification transistor Tr1. The base current Ib is amplified by the amplification transistor Tr1 and becomes a collector current Ic, and a radio frequency signal corresponding to the collector current Ic is output from the output terminal. Also, a large current, which is the sum of the base current Ib and the collector current Ic, flows from the emitter terminal to the ground.

The power amplifier 12 includes, for example, an amplification transistor Tr2 (second amplification transistor element) and a second bias circuit. The amplification transistor Tr2 is, for example, a grounded-emitter bipolar transistor including a collector, an emitter, and a base, amplifies a radio frequency current input to the base, and outputs the amplified radio frequency current from the collector. Also, the amplification transistor Tr2 may instead be a field-effect transistor including a drain, a source, and a gate. The second bias circuit is electrically connected to the base of the amplification transistor Tr2 and includes a function to optimize the operating point of the amplification transistor Tr2 by applying a bias voltage to the base.

With the circuit configuration of the power amplifier 12 described above, a radio frequency signal input from the input terminal becomes a base current Ib that flows from the base to the emitter of the amplification transistor Tr2. The base current Ib is amplified by the amplification transistor Tr2 and becomes a collector current Ic, and a radio frequency signal corresponding to the collector current Ic is output from the output terminal. Also, a large current, which is the sum of the base current Ib and the collector current Ic, flows from the emitter terminal to the ground.

The temperature sensor 51 is disposed on the surface or inside of the radio frequency module 1 and measures the temperature of a part of the radio frequency module 1 in contact with the temperature sensor 51.

The PA control circuit 50 is an example of a control circuit and controls amplification operations of the power amplifiers 11 and 12 according to a measurement value of the temperature sensor 51. Specifically, the PA control circuit 50 adjusts the gains of the power amplifiers 11 and 12 based on, for example, the measurement value of the temperature sensor 51 and digital control signals MIPI and GPIO input via the control signal terminal 113.

Here, the PA control circuit 50 may be formed as one semiconductor integrated circuit (IC). The semiconductor IC may be formed of, for example, a complementary metal oxide semiconductor (CMOS). Specifically, the semiconductor IC is formed by a Silicon on Insulator (SOI) process. This makes it possible to manufacture the semiconductor IC at a low cost. The semiconductor IC may be formed of at least one of GaAs, SiGe, and GaN. This makes it possible to output a radio frequency signal with high-quality amplification performance and noise performance.

The low-noise amplifier 21 amplifies a radio frequency signal in the communication band A with low noise and outputs the amplified radio frequency signal to a reception output terminal 121. Also, the low-noise amplifier 22 amplifies a radio frequency signal in the communication band B with low noise and outputs the amplified radio frequency signal to a reception output terminal 122.

The transmission filter 61T is an example of a first filter, is connected to the output terminal of the power amplifier 11 via the matching circuit 31, and transmits the first transmission signal in the communication band A. The transmission filter 61T is disposed in a transmission path AT connecting the transmission input terminal 111 to the antenna connection terminal 100. Also, the transmission filter 62T is an example of a second filter, is connected to the output terminal of the power amplifier 12 via the matching circuit 32, and transmits the second transmission signal in the communication band B. The transmission filter 62T is connected to a transmission path BT connecting the transmission input terminal 112 to the antenna connection terminal 100.

The reception filter 61R is connected to a reception path AR connecting the reception output terminal 121 to the antenna connection terminal 100 and transmits a first reception signal in the communication band A. Also, the reception filter 62R is connected to a reception path BR connecting the reception output terminal 122 to the antenna connection terminal 100 and transmits a second reception signal in the communication band B.

The transmission filter 61T and the reception filter 61R constitute a duplexer 61 with the communication band A as a pass band. Also, the transmission filter 62T and the reception filter 62R constitute a duplexer 62 with the communication band B as a pass band.

Each of the duplexers 61 and 62 may also be a multiplexer constituted only by multiple transmission filters or a multiplexer constituted by multiple duplexers.

The transmission path AT transmits the first transmission signal in the communication band A. One end of the transmission path AT is connected to the antenna connection terminal 100, and another end of the transmission path AT is connected to the transmission input terminal 111. The transmission path BT transmits the second transmission signal in the communication band B. One end of the transmission path BT is connected to the antenna connection terminal 100, and another end of the transmission path BT is connected to the transmission input terminal 112.

The reception path AR transmits the first reception signal in the communication band A. One end of the reception path AR is connected to the antenna connection terminal 100, and another end of the reception path AR is connected to the reception output terminal 121. The reception path BR transmits the second reception signal in the communication band B. One end of the reception path BR is connected to the antenna connection terminal 100, and another end of the reception path BR is connected to the reception output terminal 122.

The matching circuit 31 is connected to a transmission path connecting the power amplifier 11 to the transmission filter 61T and provides impedance matching between the power amplifier 11 and the transmission filter 61T. The matching circuit 32 is connected to a transmission path connecting the power amplifier 12 to the transmission filter 62T and provides impedance matching between the power amplifier 12 and the transmission filter 62T.

The matching circuit 33 is connected to a reception path connecting the low-noise amplifier 21 to the reception filter 61R and provides impedance matching between the low-noise amplifier 21 and the reception filter 61R. The matching circuit 34 is connected to a reception path connecting the low-noise amplifier 22 to the reception filter 62R and provides impedance matching between the low-noise amplifier 22 and the reception filter 62R.

The matching circuit 35 is connected to a path connecting the switch 41 to the duplexer 61 and provides impedance matching between the combination of the antenna 2 and the switch 41 and the duplexer 61. The matching circuit 36 is connected to a path connecting the switch 41 to the duplexer 62 and provides impedance matching between the combination of the antenna 2 and the switch 41 and the duplexer 62.

The switch 41 is an example of an antenna switch, is connected to the antenna connection terminal 100, and switches between a connection (1) between the antenna connection terminal 100 and the transmission path AT and the reception path AR and a connection (2) between the antenna connection terminal 100 and the transmission path BT and the reception path BR. The switch 41 is implemented by a multi-connection switch circuit capable of establishing the connections (1) and (2) simultaneously.

Each of the power amplifiers 11 and 12 and the low-noise amplifiers 21 and 22 is implemented by, for example, one of a Si-based CMOS and a field-effect transistor (FET) or a hetero-bipolar transistor (HBT) including GaAs.

In the above-described configuration of the radio frequency module 1, the power amplifier 11, the matching circuit 31, the transmission filter 61T, the matching circuit 35, and the switch 41 constitute a first transmitter circuit that transmits the first transmission signal in the communication band A toward the antenna connection terminal 100. Also, the switch 41, the matching circuit 35, the reception filter 61R, the matching circuit 33, and the low-noise amplifier 21 constitute a first receiver circuit that transmits the first reception signal in the communication band A from the antenna 2 via the antenna connection terminal 100.

Also, the power amplifier 12, the matching circuit 32, the transmission filter 62T, the matching circuit 36, and the switch 41 constitute a second transmitter circuit that transmits the first transmission signal in the communication band B toward the antenna connection terminal 100. Also, the switch 41, the matching circuit 36, the reception filter 62R, the matching circuit 34, and the low-noise amplifier 22 constitute a second receiver circuit that transmits the second reception signal in the communication band B from the antenna 2 via the antenna connection terminal 100.

With the above circuit configuration, the radio frequency module 1 can simultaneously transmit at least the first transmission signal in the communication band A and the second transmission signal in the communication band B.

In the radio frequency module of the present disclosure, the two transmitter circuits and the two receiver circuits described above need not necessarily be connected to the antenna connection terminal 100 via the switch 41, and the two transmitter circuits and the two receiver circuits may be connected to the antenna 2 via different terminals. Also, as long as the first transmitter circuit, the second transmitter circuit, the temperature sensor 51, and the PA control circuit 50 are included, the radio frequency module of the present disclosure may have any other configuration.

In the radio frequency module according to the present disclosure, as long as the power amplifier 11 is included, the first transmitter circuit may have any other configuration. Also, as long as the power amplifier 12 is included, the second transmitter circuit may have any other configuration.

Here, when high-power transmission signals are transmitted simultaneously from the power amplifiers 11 and 12 in the radio frequency module 1, the temperature of the radio frequency module 1 may locally increase due to heat generated by the power amplifiers 11 and 12. This may cause a problem that the temperature of the radio frequency module 1 cannot be measured accurately due to temperature unevenness resulting from the local temperature increase, the temperature of one of the power amplifiers 11 and 12 increases more than expected, and the performance of the power amplifiers 11 and 12 is degraded.

In contrast, with the configuration of the radio frequency module 1 described below, the temperature can be measured accurately even when the first transmission signal and the second transmission signal are transmitted simultaneously, and the performance degradation of the power amplifiers 11 and 12 can be suppressed.

Figure 2:
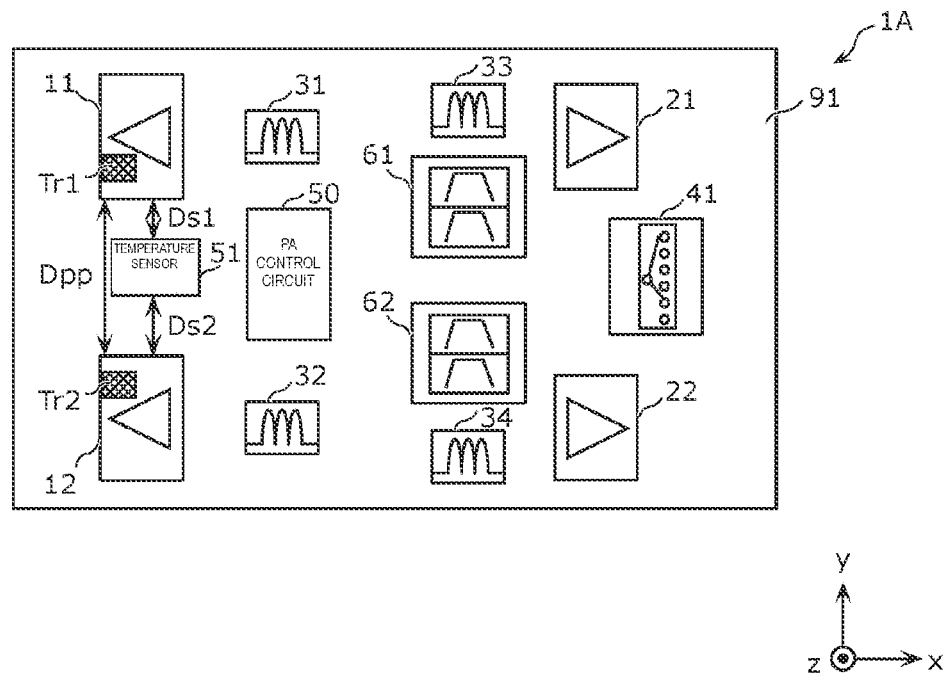
FIG. 2 is a plan-view schematic diagram of a radio frequency module according to a first example.

2. Layout of Circuit Elements of Radio Frequency Module 1A According to First Example FIG. 2 is a plan-view schematic diagram of a radio frequency module 1A according to a first example. FIG. 2 illustrates the layout of circuit elements when the major surface of a module substrate 91 is viewed from the positive z-axis direction.

The radio frequency module 1A according to the first example shows a specific example of the layout of circuit elements constituting the radio frequency module 1 according to the embodiment.

As illustrated in FIG. 2, the radio frequency module 1A of this example includes the module substrate 91 in addition to the circuit elements illustrated in FIG. 1.

The module substrate 91 has a first major surface and a second major surface that face each other, and the transmitter circuits and the receiver circuits described above are mounted on or over the module substrate 91. The module substrate 91 is implemented by, for example, a low temperature co-fired ceramics (LTCC) substrate with a multilayer structure formed by stacking multiple dielectric layers, a high temperature co-fired ceramics (HTCC) substrate, a component built-in substrate, a substrate including a redistribution layer (RDL), or a printed-circuit board. The antenna connection terminal 100, the transmission input terminals 111 and 112, the reception output terminals 121 and 122, and the control signal terminal 113 may be formed on or in the module substrate 91.

As illustrated in FIG. 2, in the radio frequency module 1A according to this example, the power amplifiers 11 and 12, the PA control circuit 50, the temperature sensor 51, the duplexers 61 and 62, the switch 41, the matching circuits 31, 32, 33, and 34, and the low-noise amplifiers 21 and 22 are disposed on or over the major surface of the module substrate 91. Although not illustrated in FIG. 2, the matching circuits 35 and 36 may be disposed on or over the major surface of the module substrate 91 or may be embedded in the module substrate 91.

Also, although not illustrated in FIG. 2, wires constituting the transmission paths AT and BT and the reception paths AR and BR illustrated in FIG. 1 are formed inside of and on the major surface of the module substrate 91. Also, the wires may be bonding wires the ends of which are connected to the major surface and the corresponding circuit elements constituting the radio frequency module 1A, or may be terminals, electrodes, or wires formed on the surfaces of the circuit elements constituting the radio frequency module 1A.

A resin component may be provided on or over the major surface of the module substrate 91 to cover the circuit elements constituting the transmitter circuits and the receiver circuits. This makes it possible to improve the reliability in, for example, the mechanical strength and the moisture resistance of the circuit elements constituting the transmitter circuits and the receiver circuits.

In the radio frequency module 1A according to this example, as illustrated in FIG. 2, a distance Ds1 between the temperature sensor 51 and the power amplifier 11 is less than or equal to a distance Dpp between the power amplifier 11 and the power amplifier 12. Also, a distance Ds2 between the temperature sensor 51 and the power amplifier 12 is less than or equal to the distance Dpp.

When high-power transmission signals are transmitted simultaneously from the power amplifiers 11 and 12, the temperature of the radio frequency module 1 increases locally due to heat generated by the power amplifiers 11 and 12. Here, because the temperature sensor 51 is disposed close to the power amplifiers 11 and 12 at distances less than or equal to the distance Dpp, the temperature sensor 51 can accurately measure a local temperature increase in a region close to the power amplifiers 11 and 12 where the sum of the heat generated by the power amplifier 11 and the heat generated by the power amplifier 12 becomes maximum. This in turn makes it possible to accurately measure a local peak temperature of the radio frequency module 1A even when the first transmission signal and the second transmission signal are transmitted simultaneously and thereby makes it possible to reduce the degradation of the performance of the power amplifiers 11 and 12 resulting from the increase in temperature.

In the radio frequency module 1A according to this example, the maximum output power of the power amplifier 11 is greater than the maximum output power of the power amplifier 12. In this relationship, the distance Ds1 between the temperature sensor 51 and the power amplifier 11 is less than or equal to the distance Ds2 between the temperature sensor 51 and the power amplifier 12.

The power amplifiers 11 and 12 correspond to, for example, a high power class and a non-high power class, respectively. Power classes are classifications of terminal output power defined by, for example, the maximum output power; and a smaller power class value indicates higher output power supported. The maximum output power of the high power class is greater than the maximum output power of the non-high power class. The maximum output power is measured according to a method defined by, for example, the 3rd Generation Partnership Project (3GPP).

The power amplifier 11 corresponds to, for example, the power class 2, and the power amplifier 12 corresponds to, for example, the power class 3.

When high-power transmission signals are transmitted simultaneously from the power amplifiers 11 and 12, the temperature of the radio frequency module 1 increases locally due to heat generated by the power amplifiers 11 and 12. Particularly, when the maximum output power of the power amplifier 11 is greater than the maximum output power of the power amplifier 12, the local peak temperature of the radio frequency module 1A is observed in a region that is closer to the power amplifier 11 than to the power amplifier 12. In this example, because the distance Ds1 is less than or equal to the distance Ds2, it is possible to accurately measure a local temperature increase in a region where the sum of heat generated by the power amplifier 11 and heat generated by the power amplifier 12 becomes maximum. This in turn makes it possible to accurately measure a local peak temperature of the radio frequency module 1A even when the first transmission signal and the second transmission signal are transmitted simultaneously and thereby makes it possible to reduce the degradation of the performance of the power amplifiers 11 and 12 resulting from the increase in temperature.

In the radio frequency module 1A according to this example, the temperature sensor 51 is disposed between the power amplifier 11 and the power amplifier 12.

The region between the power amplifier 11 and the power amplifier 12 is where a local peak temperature is observed when high-power transmission signals are transmitted simultaneously from the power amplifiers 11 and 12. Accordingly, the local peak temperature of the radio frequency module 1A can be measured more accurately. Also, placing the temperature sensor 51 in the position described above makes it possible to reduce the thermal interference between the power amplifier 11 and the power amplifier 12.

Also, in the radio frequency module 1A according to this example, the temperature sensor 51 is disposed between the amplification transistor Tr1 and the amplification transistor Tr2.

In the region between the power amplifier 11 and the power amplifier 12, particularly the region between the amplification transistor Tr1 that is the heat source of the power amplifier 11 and the amplification transistor Tr2 that is the heat source of the power amplifier 12 is where the local peak temperature is observed when high-power transmission signals are transmitted simultaneously from the power amplifiers 11 and 12. Accordingly, the local peak temperature of the radio frequency module 1A can be measured more accurately.

In the radio frequency module 1A according to this example, no other circuit component is disposed between the temperature sensor 51 and the power amplifier 11.

With this configuration, heat generated by the power amplifier 11 can be transferred to the temperature sensor 51 without necessarily being absorbed by other circuit components. Accordingly, the local peak temperature of the radio frequency module 1A can be measured more accurately.

In the radio frequency module 1A according to this example, the distance Ds1 between the temperature sensor 51 and the power amplifier 11 is less than the distance between the temperature sensor 51 and the transmission filter 61T, and the distance Ds2 between the temperature sensor 51 and the power amplifier 12 is less than the distance between the temperature sensor 51 and the transmission filter 62T.

The transmission filters 61T and 62T transmit high-power transmission signals and are therefore circuit components that tend to generate heat. For this reason, the temperature sensor 51 is disposed closer to the power amplifier 11 than to the transmission filter 61T and the temperature sensor 51 is disposed closer to the power amplifier 12 than to the transmission filter 62T so that the local peak temperature resulting from heat generated by the power amplifiers 11 and 12 can be measured accurately.

Figure 3:
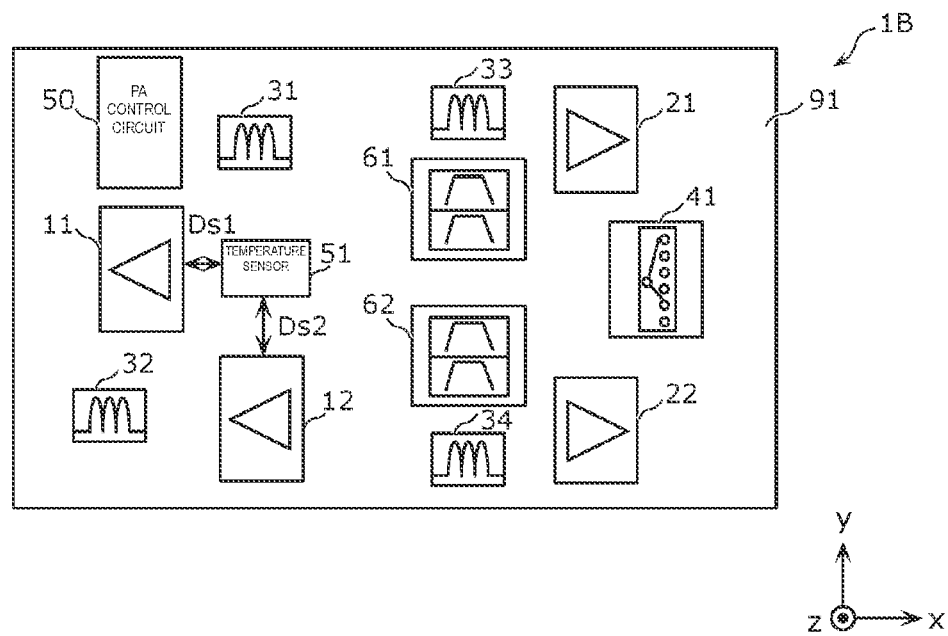
FIG. 3 is a plan-view schematic diagram of a radio frequency module according to a first variation.

3. Layout of Circuit Elements of Radio Frequency Module 1B According to First Variation FIG. 3 is a plan-view schematic diagram of a radio frequency module 1B according to a first variation. FIG. 3 illustrates the layout of circuit elements when the major surface of the module substrate 91 is viewed from the positive z-axis direction. The radio frequency module 1B according to the first variation shows a specific example of the layout of circuit elements constituting the radio frequency module 1 according to the embodiment. The radio frequency module 1B according to this variation differs from the radio frequency module 1A according to the first example in the layout of the power amplifiers 11 and 12, the temperature sensor 51, and the PA control circuit 50. Below, regarding the radio frequency module 1B of this variation, descriptions of configurations that are the same as those of the radio frequency module 1A of the first example are omitted, and configurations different from those of the radio frequency module 1A are mainly described.

In the radio frequency module 1B according to this variation, the maximum output power of the power amplifier 11 is greater than the maximum output power of the power amplifier 12. In this relationship, the distance Ds1 between the temperature sensor 51 and the power amplifier 11 is less than or equal to the distance Ds2 between the temperature sensor 51 and the power amplifier 12.

With this configuration, because the distance Ds1 is less than or equal to the distance Ds2, the temperature sensor 51 can accurately measure a local temperature increase in a region where the sum of the heat generated by the power amplifier 11 and the heat generated by the power amplifier 12 becomes maximum. This in turn makes it possible to accurately measure a local peak temperature of the radio frequency module 1B even when the first transmission signal and the second transmission signal are transmitted simultaneously and thereby makes it possible to reduce the degradation of the performance of the power amplifiers 11 and 12.

In plan view of the module substrate 91 of the radio frequency module 1B according to this variation, the temperature sensor 51 and the power amplifier 11 are disposed to face each other in the x-axis direction, and no other circuit component is disposed between the temperature sensor 51 and the power amplifier 11.

With this configuration, heat generated by the power amplifier 11 can be transferred to the temperature sensor 51 without necessarily being absorbed by other circuit components. Accordingly, the local peak temperature of the radio frequency module 1B can be measured more accurately.

In plan view of the module substrate 91, the temperature sensor 51 and the power amplifier 12 are disposed to face each other in the y-axis direction, and no other circuit component is disposed between the temperature sensor 51 and the power amplifier 12.

With this configuration, heat generated by the power amplifier 12 can be transferred to the temperature sensor 51 without necessarily being absorbed by other circuit components. Accordingly, the local peak temperature of the radio frequency module 1B can be measured more accurately.

Also, in the radio frequency module 1B of this variation, the distance Ds1 between the temperature sensor 51 and the power amplifier 11 is less than the distance between the temperature sensor 51 and the transmission filter 61T, and the distance Ds2 between the temperature sensor 51 and the power amplifier 12 is less than the distance between the temperature sensor 51 and the transmission filter 62T.

The transmission filters 61T and 62T transmit high-power transmission signals and are therefore circuit components that tend to generate heat. For this reason, the temperature sensor 51 is disposed closer to the power amplifier 11 than to the transmission filter 61T and the temperature sensor 51 is disposed closer to the power amplifier 12 than to the transmission filter 62T so that the local peak temperature resulting from heat generated by the power amplifiers 11 and 12 can be measured accurately.

Figure 4:
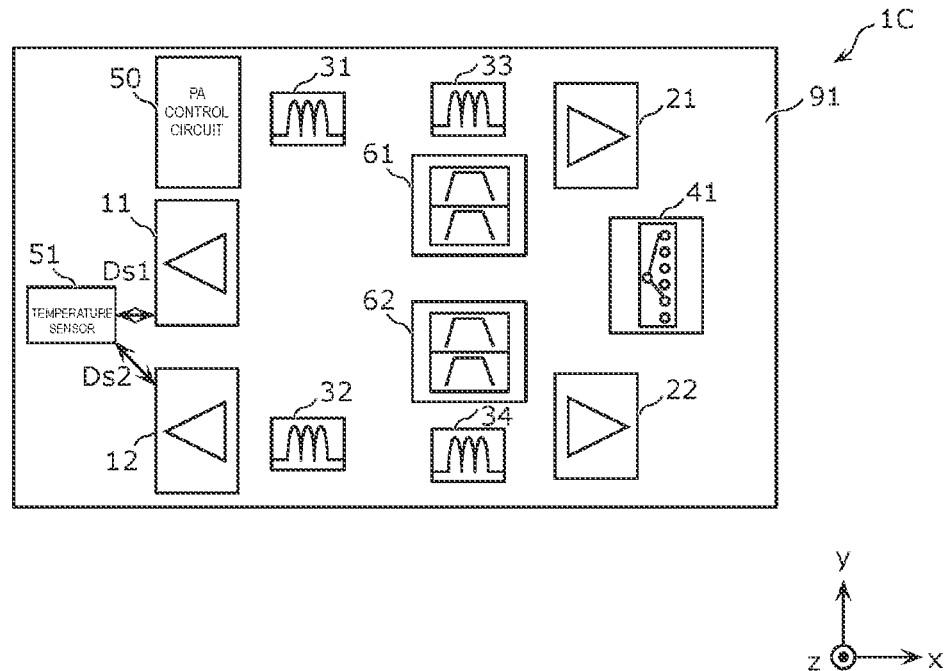
FIG. 4 is a plan-view schematic diagram of a radio frequency module according to a second variation.

4. Layout of Circuit Elements of Radio Frequency Module 1C According to Second Variation FIG. 4 is a plan-view schematic diagram of a radio frequency module 1C according to a second variation. FIG. 4 illustrates the layout of circuit elements when the major surface of the module substrate 91 is viewed from the positive z-axis direction. The radio frequency module 1C according to the second variation shows a specific example of the layout of circuit elements constituting the radio frequency module 1 according to the embodiment. The radio frequency module 1C according to this variation differs from the radio frequency module 1B according to the first variation in the layout of the power amplifiers 11 and 12, the temperature sensor 51, and the PA control circuit 50. Below, regarding the radio frequency module 1C of this variation, descriptions of configurations that are the same as those of the radio frequency module 1B of the first variation are omitted, and configurations different from those of the radio frequency module 1B are mainly described.

In the radio frequency module 1C according to this variation, the maximum output power of the power amplifier 11 is greater than the maximum output power of the power amplifier 12. In this relationship, the distance Ds1 between the temperature sensor 51 and the power amplifier 11 is less than or equal to the distance Ds2 between the temperature sensor 51 and the power amplifier 12.

With this configuration, because the distance Ds1 is less than or equal to the distance Ds2, it is possible to accurately measure a local temperature increase in a region where the sum of the heat generated by the power amplifier 11 and the heat generated by the power amplifier 12 becomes maximum. This in turn makes it possible to accurately measure a local peak temperature of the radio frequency module 1C even when the first transmission signal and the second transmission signal are transmitted simultaneously and thereby makes it possible to reduce the degradation of the performance of the power amplifiers 11 and 12.

In plan view of the module substrate 91 of the radio frequency module 1C according to this variation, no other circuit component is disposed between the temperature sensor 51 and the power amplifier 11, and no other circuit component is disposed between the temperature sensor 51 and the power amplifier 12.

With this configuration, heat generated by the power amplifier 11 can be transferred to the temperature sensor 51 without necessarily being absorbed by other circuit components. Accordingly, the local peak temperature of the radio frequency module 1C can be measured more accurately.

Also, in the radio frequency module 1C of this variation, the distance Ds1 between the temperature sensor 51 and the power amplifier 11 is less than the distance between the temperature sensor 51 and the transmission filter 61T, and the distance Ds2 between the temperature sensor 51 and the power amplifier 12 is less than the distance between the temperature sensor 51 and the transmission filter 62T.

The transmission filters 61T and 62T transmit high-power transmission signals and are therefore circuit components that tend to generate heat. For this reason, the temperature sensor 51 is disposed closer to the power amplifier 11 than to the transmission filter 61T and the temperature sensor 51 is disposed closer to the power amplifier 12 than to the transmission filter 62T so that the local peak temperature resulting from heat generated by the power amplifiers 11 and 12 can be measured accurately.

Figure 5:
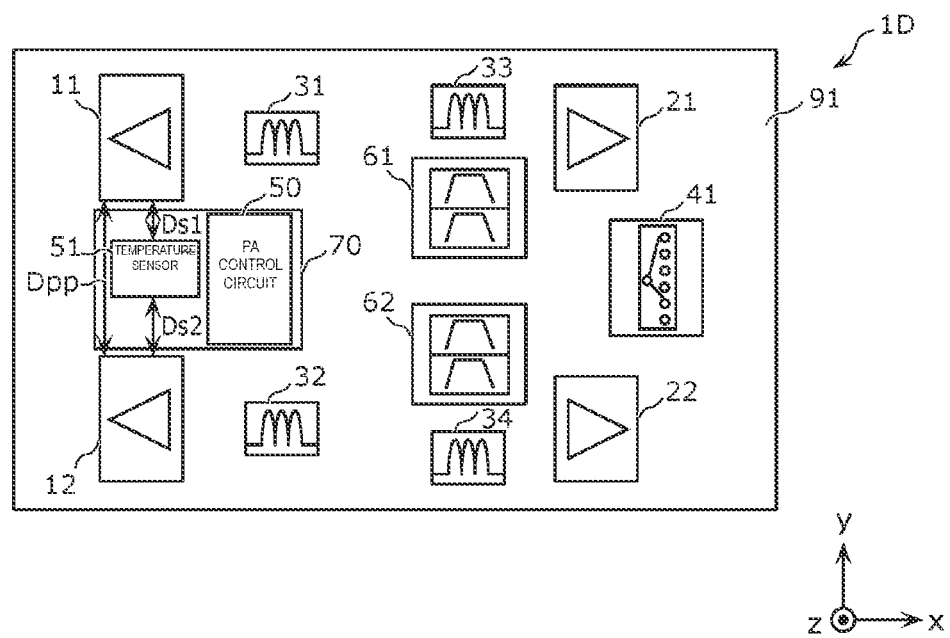
FIG. 5 is a plan-view schematic diagram of a radio frequency module according to a second example.

5. Layout of Circuit Elements of Radio Frequency Module 1D According to Second Example FIG. 5 is a plan-view schematic diagram of a radio frequency module 1D according to a second example. FIG. 5 illustrates the layout of circuit elements when the major surface of the module substrate 91 is viewed from the positive z-axis direction. The radio frequency module 1D according to the second example shows a specific example of the layout of circuit elements constituting the radio frequency module 1 according to the embodiment. The radio frequency module 1D according to this variation differs from the radio frequency module 1A according to the first example in the layout of the temperature sensor 51 and the PA control circuit 50. Below, regarding the radio frequency module 1D of this example, descriptions of configurations that are the same as those of the radio frequency module 1A of the first example are omitted, and configurations different from those of the radio frequency module 1A are mainly described.

In the radio frequency module 1D according to this example, the temperature sensor 51 and the PA control circuit 50 are included in one semiconductor IC 70. Here, "multiple circuit elements are included in a semiconductor IC" indicates a state in which the multiple circuit elements are formed on the surface of or inside of one semiconductor substrate or a state in which the multiple circuit elements are integrated in one package. The one semiconductor substrate and the one package described above are different from the module substrate 91 and are also different from an external substrate on which the radio frequency module 1D is mounted.

With this configuration, because the temperature sensor 51 and the PA control circuit 50 are formed as one semiconductor IC 70, the size of the radio frequency module 1D can be further reduced. Also, when the temperature sensor 51 and the PA control circuit 50 are disposed on or over the same semiconductor substrate in the semiconductor IC 70, a temperature warning indicating that the temperature has exceeded a predetermined temperature can be transmitted to the PA control circuit 50 with low latency via wiring formed on the semiconductor substrate and connecting the temperature sensor 51 to the PA control circuit 50.

In the radio frequency module 1D according to this example, the maximum output power of the power amplifier 11 is greater than the maximum output power of the power amplifier 12. In this relationship, the distance Ds1 between the temperature sensor 51 and the power amplifier 11 is less than or equal to the distance Ds2 between the temperature sensor 51 and the power amplifier 12.

With this configuration, because the distance Ds1 is less than or equal to the distance Ds2, it is possible to accurately measure a local temperature increase in a region where the sum of the heat generated by the power amplifier 11 and the heat generated by the power amplifier 12 becomes maximum. This in turn makes it possible to accurately measure a local peak temperature of the radio frequency module 1D even when the first transmission signal and the second transmission signal are transmitted simultaneously and thereby makes it possible to reduce the degradation of the performance of the power amplifiers 11 and 12.

Also, in the radio frequency module 1D according to this example, the semiconductor IC 70 is disposed between the power amplifier 11 and the power amplifier 12.

The region between the power amplifier 11 and the power amplifier 12 is where a local peak temperature is observed when high-power transmission signals are transmitted simultaneously from the power amplifiers 11 and 12. Accordingly, the local peak temperature of the radio frequency module 1D can be measured more accurately. Also, placing the semiconductor IC 70 in the above-described position makes it possible to reduce the thermal interference between the power amplifier 11 and the power amplifier 12.

Also, in the radio frequency module 1D according to this example, no other circuit component is disposed between the semiconductor IC 70 and the power amplifier 11.

With this configuration, heat generated by the power amplifier 11 can be transferred to the temperature sensor 51 without necessarily being absorbed by other circuit components. Accordingly, the local peak temperature of the radio frequency module 1D can be measured more accurately.

In the radio frequency module 1D according to this example, the distance Ds1 between the temperature sensor 51 and the power amplifier 11 is less than the distance between the temperature sensor 51 and the transmission filter 61T, and the distance Ds2 between the temperature sensor 51 and the power amplifier 12 is less than the distance between the temperature sensor 51 and the transmission filter 62T.

The transmission filters 61T and 62T transmit high-power transmission signals and are therefore circuit components that tend to generate heat. For this reason, the temperature sensor 51 is disposed closer to the power amplifier 11 than to the transmission filter 61T and the temperature sensor 51 is disposed closer to the power amplifier 12 than to the transmission filter 62T so that the local peak temperature resulting from heat generated by the power amplifiers 11 and 12 can be measured accurately.

Figure 6:
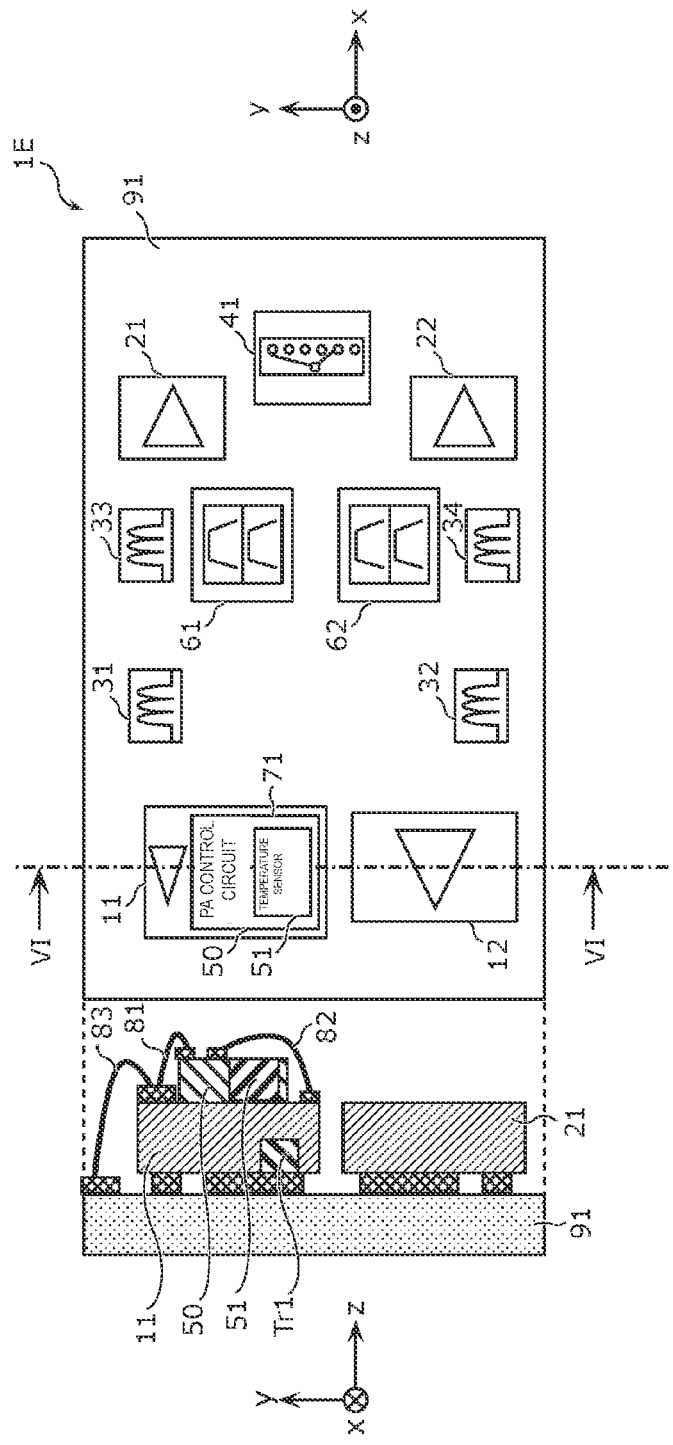
FIG. 6 is a plan-view schematic diagram and a cross-sectional schematic diagram of a radio frequency module according to a third example.

6. Layout of Circuit Elements of Radio Frequency Module 1E According to Third Example FIG. 6 is a plan-view schematic diagram and a cross-sectional schematic diagram of a radio frequency module 1E according to a third example. FIG. 6 includes a plan-view layout drawing of circuit elements when the major surface of the module substrate 91 is viewed from the positive z-axis direction and a cross-sectional drawing taken along line VI-VI of the plan-view layout drawing. The radio frequency module 1E according to the third example shows a specific example of the layout of circuit elements constituting the radio frequency module 1 according to the embodiment. The radio frequency module 1E according to this example differs from the radio frequency module 1D according to the second example in the layout of the power amplifiers 11 and 12, the temperature sensor 51, and the PA control circuit 50. Below, regarding the radio frequency module 1E of this example, descriptions of configurations that are the same as those of the radio frequency module 1D of the second example are omitted, and configurations different from those of the radio frequency module 1D are mainly described.

In the radio frequency module 1E according to this example, the maximum output power of the power amplifier 11 is greater than the maximum output power of the power amplifier 12.

In the radio frequency module 1E according to this example, the temperature sensor 51 and the PA control circuit 50 are included in one semiconductor IC 71. The semiconductor IC 71 is disposed above (in the positive z-axis direction) the major surface of the module substrate 91, and the power amplifier 11 is disposed between the major surface and the semiconductor IC 71. With this configuration, because the temperature sensor 51 and the PA control circuit 50 are formed as one semiconductor IC 71 and the power amplifier 11 and the semiconductor IC 71 are stacked on each other, the size and the area of the radio frequency module 1E can be reduced.

Here, as illustrated in FIG. 6, in plan view of the major surface of the module substrate 91, the temperature sensor 51 and the power amplifier 11 at least partially overlap each other. Accordingly, the distance Ds1 between the temperature sensor 51 and the power amplifier 11 is less than or equal to the distance Ds2 between the temperature sensor 51 and the power amplifier 12.

With the above-described configuration, because the distance Ds1 is less than or equal to the distance Ds2, it is possible to accurately measure a local temperature increase in a region where the sum of the heat generated by the power amplifier 11 and the heat generated by the power amplifier 12 becomes maximum. This in turn makes it possible to accurately measure a local peak temperature of the radio frequency module 1E even when the first transmission signal and the second transmission signal are transmitted simultaneously and thereby makes it possible to reduce the degradation of the performance of the power amplifiers 11 and 12.

Also, in the radio frequency module 1E according to this example, in plan view of the major surface of the module substrate 91, the temperature sensor 51 and the amplification transistor Tr1 at least partially overlap each other.

This configuration makes it possible to reduce the distance between the temperature sensor 51 and the power amplifier 11, particularly, between the temperature sensor 51 and the amplification transistor Tr1 that is the heat source of the power amplifier 11. This in turn makes it possible to more accurately measure a local peak temperature of the radio frequency module 1E even when the first transmission signal and the second transmission signal are transmitted simultaneously.

In the radio frequency module 1E according to this example, no other circuit component is disposed between the temperature sensor 51 and the power amplifier 11.

With this configuration, heat generated by the power amplifier 11 can be transferred to the temperature sensor 51 without necessarily being absorbed by other circuit components. Accordingly, the local peak temperature of the radio frequency module 1E can be measured more accurately.

In the radio frequency module 1E according to this example, the distance Ds1 between the temperature sensor 51 and the power amplifier 11 is less than the distance between the temperature sensor 51 and the transmission filter 61T, and the distance Ds2 between the temperature sensor 51 and the power amplifier 12 is less than the distance between the temperature sensor 51 and the transmission filter 62T.

The transmission filters 61T and 62T transmit high-power transmission signals and are therefore circuit components that tend to generate heat. For this reason, the temperature sensor 51 is disposed closer to the power amplifier 11 than to the transmission filter 61T and the temperature sensor 51 is disposed closer to the power amplifier 12 than to the transmission filter 62T so that the local peak temperature resulting from heat generated by the power amplifiers 11 and 12 can be measured accurately.

In the radio frequency module 1E according to this example, electrodes formed on the top surface of the semiconductor IC 71 are connected to electrodes formed on the top surface of the power amplifier 11 via bonding wires 81 and 82. Also, an electrode formed on the top surface of the power amplifier 11 is connected to an electrode formed on the major surface of the module substrate 91 via a bonding wire 83.

Using the bonding wires 81 and 82 eliminates the need to provide regions for forming electrodes on the major surface of the module substrate 91 and thereby makes it possible to reduce the size of the radio frequency module 1E.

7. Layout of Circuit Elements of Radio Frequency Module 1F According to Fourth Example FIGS. 7AA and 7AB are plan-views schematic diagram of a radio frequency module 1F according to a fourth example.

Figure 7A:
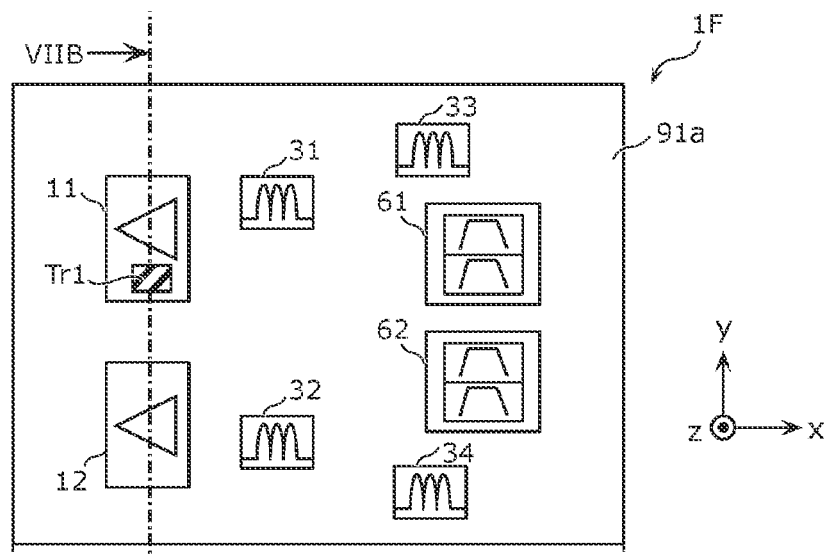
FIGS. 7AA and 7AB are plan-views schematic diagram of a radio frequency module according to a fourth example.
Figure 7A:
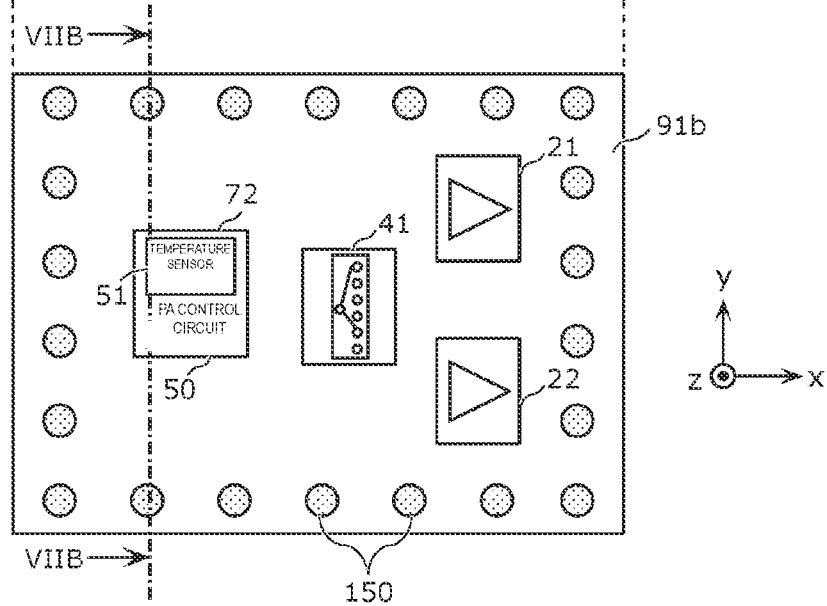
Figure 7B:
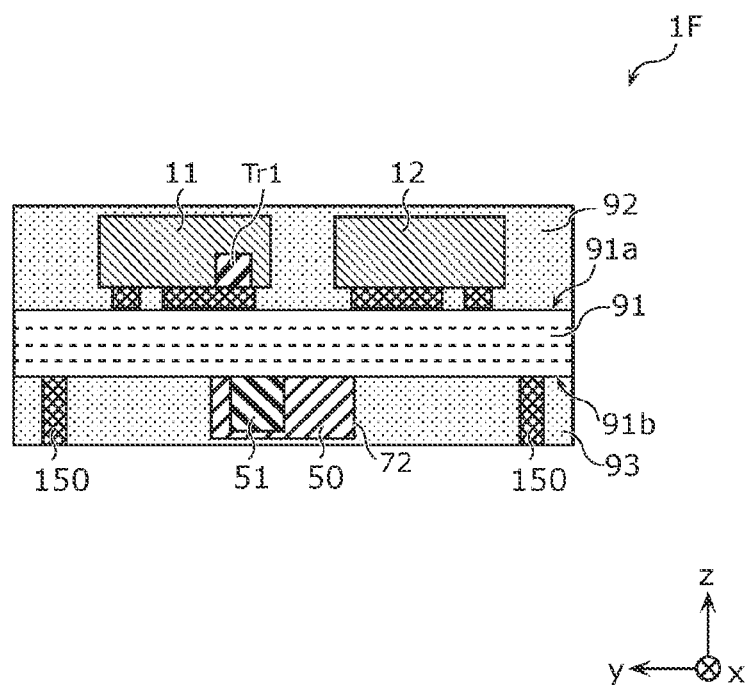
FIG. 7B is a cross-sectional schematic diagram of the radio frequency module according to the fourth example.

FIG. 7B is a cross-sectional schematic diagram of the radio frequency module 1F according to the fourth example and is specifically a cross-sectional view taken along line VIIB-VIIB of FIGS. 7AA and 7AB. Here, the module substrate 91 includes major surfaces 91a and 91b that face each other, and FIG. 7AA illustrates the layout of circuit elements when the major surface 91a is viewed from the positive z-axis direction. On the other hand, FIG. 7AB is a transparent view of the layout of circuit elements when the major surface 91b is viewed from the positive z-axis direction.

The radio frequency module 1E according to the fourth example shows a specific example of the layout of circuit elements constituting the radio frequency module 1 according to the embodiment. The radio frequency module 1F according to this example differs from the radio frequency module 1A according to the first example in that circuit elements are mounted on or over the two surfaces of the module substrate 91. Below, regarding the radio frequency module 1F of this example, descriptions of configurations that are the same as those of the radio frequency module 1A of the first example are omitted, and configurations different from those of the radio frequency module 1A are mainly described.

As illustrated in FIGS. 7A and 7B, the radio frequency module 1F of this example includes, in addition to the circuit configuration illustrated in FIG. 1, the module substrate 91, resin components 92 and 93, and external connection terminals 150.

The module substrate 91 includes the major surface 91a (first major surface) and the major surface 91b (second major surface) that face each other, and the transmitter circuits and the receiver circuits described above are mounted on or over the module substrate 91. The module substrate 91 is implemented by, for example, an LTCC substrate with a multilayer structure formed by stacking multiple dielectric layers, an HTCC substrate, a component built-in substrate, a substrate including an RDL, or a printed-circuit board. The antenna connection terminal 100, the transmission input terminals 111 and 112, the reception output terminals 121 and 122, and the control signal terminal 113 may be formed on or in the module substrate 91.

The resin component 92 is disposed on the major surface 91a of the module substrate 91 to cover parts of the transmitter circuits, parts of the receiver circuits, and the major surface 91a of the module substrate 91 and has a function to secure the reliability in, for example, the mechanical strength and the moisture resistance of the circuit elements constituting the transmitter circuits and the receiver circuits. The resin component 93 is disposed on the major surface 91b of the module substrate 91 to cover parts of the transmitter circuits, parts of the receiver circuits, and the major surface 91b of the module substrate 91 and has a function to secure the reliability in, for example, the mechanical strength and the moisture resistance of the circuit elements constituting the transmitter circuits and the receiver circuits. Here, the resin components 92 and 93 are optional components of the radio frequency module according to the present disclosure.

As illustrated in FIGS. 7AA and 7AB, in the radio frequency module 1F according to this example, the power amplifiers 11 and 12, the duplexers 61 and 62, and the matching circuits 31, 32, 33, and 34 are disposed on or over the major surface 91a of the module substrate 91. On the other hand, the PA control circuit 50, the temperature sensor 51, the switch 41, and the low-noise amplifiers 21 and 22 are disposed on or over the major surface 91b of the module substrate 91. Although not illustrated in FIGS. 7AA and 7AB, the matching circuits 35 and 36 may be disposed on either one of the major surfaces 91a and 91b of the module substrate 91 or may be embedded in the module substrate 91.

Also, although not illustrated in FIGS. 7AA, 7AB and 7B, wires constituting the transmission paths AT and BT and the reception paths AR and BR illustrated in FIG. 1 are formed inside of and on the major surfaces of the module substrate 91. Also, the wires may be bonding wires the ends of which are connected to the major surfaces and the corresponding circuit elements constituting the radio frequency module 1F or may be terminals, electrodes, or wires formed on the surfaces of the circuit elements constituting the radio frequency module 1A.

In the radio frequency module 1F according to this example, the maximum output power of the power amplifier 11 is greater than the maximum output power of the power amplifier 12.

In the radio frequency module 1F according to this example, the temperature sensor 51 and the PA control circuit 50 are included in one semiconductor IC 72. With this configuration, because the temperature sensor 51 and the PA control circuit 50 are formed as one semiconductor IC 72, the size of the radio frequency module 1F can be reduced.

Also, as illustrated in FIG. 7B, the semiconductor IC 72 is disposed on or over the major surface 91b, and the temperature sensor 51 and the power amplifier 11 at least partially overlap each other in plan view of the module substrate 91. In this configuration, the distance Ds1 between the temperature sensor 51 and the power amplifier 11 is less than or equal to the distance Ds2 between the temperature sensor 51 and the power amplifier 12.

With the above configuration, because the distance Ds1 is less than or equal to the distance Ds2, it is possible to accurately measure a local temperature increase in a region where the sum of the heat generated by the power amplifier 11 and the heat generated by the power amplifier 12 becomes maximum. This in turn makes it possible to accurately measure a local peak temperature of the radio frequency module 1F even when the first transmission signal and the second transmission signal are transmitted simultaneously and thereby makes it possible to reduce the degradation of the performance of the power amplifiers 11 and 12.

Also, in plan view of the module substrate 91 of the radio frequency module 1F according to this example, the temperature sensor 51 and the amplification transistor Tr1 at least partially overlap each other.

This configuration makes it possible to reduce the distance between the temperature sensor 51 and the power amplifier 11, particularly, between the temperature sensor 51 and the amplification transistor Tr1 that is the heat source of the power amplifier 11. This in turn makes it possible to more accurately measure a local peak temperature of the radio frequency module 1F even when the first transmission signal and the second transmission signal are transmitted simultaneously.

Here, in plan view of the module substrate 91 of the radio frequency module 1F according to this example, the power amplifier 11 and the semiconductor IC 72 can at least partially overlap each other. Also, in plan view of the module substrate 91, the power amplifier 12 and the semiconductor IC 72 can at least partially overlap each other. This makes it possible to shorten control wires connecting the power amplifiers 11 and 12 to the semiconductor IC 72.

The module substrate 91 can have a multi-layer structure formed by stacking multiple dielectric layers, and a ground electrode pattern can be formed on or in at least one of the multiple dielectric layers. This improves the electromagnetic-field shielding function of the module substrate 91.

Also, in the radio frequency module 1F according to this example, multiple external connection terminals 150 are disposed on or over the major surface 91b of the module substrate 91. The radio frequency module 1F exchanges electrical signals, via multiple external connection terminals 150, with an external substrate disposed to face the radio frequency module 1F from the negative z-axis direction. Also, some of the multiple external connection terminals 150 are set at the ground potential of the external substrate. Out of the major surfaces 91a and 91b, on the major surface 91b facing the external substrate, the power amplifiers 11 and 12, the heights of which cannot be easily reduced, are not mounted. Instead, the low-noise amplifiers 21 and 22, the semiconductor IC 72, and the switch 41, the heights of which can be easily reduced, are mounted on the major surface 91b. This makes it possible to reduce the height of the entire radio frequency module 1F.

The external connection terminals 150 may be columnar electrodes that pass through the resin component 93 in the z-axis direction as illustrated in FIGS. 7A and 7B, or may be bump electrodes formed on the major surface 91b. When the external connection terminals 150 are bump electrodes, the resin component 93 on the major surface 91b may be omitted.

Also, in the radio frequency module 1F according to this example, the power amplifiers 11 and 12 are disposed on or over the major surface 91a.

Among the circuit components included in the radio frequency module 1F, the power amplifiers 11 and 12 generate large amounts of heat. To improve the heat dissipation of the radio frequency module 1F, it is suitable to transfer heat generated by the power amplifiers 11 and 12 to the external substrate via a heat dissipation path with a small thermal resistance. If the power amplifiers 11 and 12 are disposed on the major surface 91b, electrode wires connected to the power amplifiers 11 and 12 are disposed on the major surface 91b. In this case, the heat dissipation path is constituted only by a planar wiring pattern that is on the major surface 91b (i.e., that extends along the xy-plane direction). The planar wiring pattern is formed of a metal thin film and therefore has a high thermal resistance. For this reason, when the power amplifiers 11 and 12 are disposed on the major surface 91b, the heat dissipation is reduced.

In contrast, when the power amplifiers 11 and 12 are disposed on or over the major surface 91a, the power amplifiers 11 and 12 can be connected to the external connection terminals 150 via through electrodes that pass through the substrate between the major surface 91a and the major surface 91b. This configuration makes it possible to eliminate the need to use, as the heat dissipation path for the power amplifiers 11 and 12, a heat dissipation path constituted only by a planar wiring pattern that extends along the xy-plane direction and has a high thermal resistance among wiring in the module substrate 91. This in turn makes it possible to provide a small radio frequency module 1F in which heat dissipation from the power amplifiers 11 and 12 to the external substrate is improved.

The low-noise amplifiers 21 and 22 and the switch 41 may be integrated into one semiconductor IC. This makes it possible to reduce the height in the z-axis direction of the radio frequency module 1F on the side of the major surface 91b and also makes it possible to reduce the component mounting area on the major surface 91b. This in turn makes it possible to reduce the size of the radio frequency module 1F.

In the radio frequency module 1F according to this example, the low-noise amplifiers 21 and 22 are disposed on or over the major surface 91b.

With this configuration, because the power amplifiers 11 and 12 for amplifying transmission signals and the low-noise amplifiers 21 and 22 for amplifying reception signals are disposed on different sides of the module substrate 91, the isolation between transmission and reception is improved.

8. Effects

As described above, the radio frequency module 1A according to the first example is capable of simultaneously transmitting the first transmission signal and the second transmission signal and includes the module substrate 91; the power amplifier 11 that is disposed on or over the module substrate 91, amplifies a radio frequency signal, and outputs the amplified radio frequency signal as the first transmission signal; the power amplifier 12 that is disposed on or over the module substrate 91, amplifies a radio frequency signal, and outputs the amplified radio frequency signal as the second transmission signal; the temperature sensor 51 disposed on or over the module substrate 91; and the PA control circuit 50 that is disposed on or over the module substrate 91 and controls amplification operations of the power amplifiers 11 and 12 according to a measurement value of the temperature sensor 51. The maximum output power of the power amplifier 11 is greater than the maximum output power of the power amplifier 12, and the distance Ds1 between the temperature sensor 51 and the power amplifier 11 is less than or equal to the distance Ds2 between the temperature sensor 51 and the power amplifier 12.

With the above configuration, because the distance Ds1 is less than or equal to the distance Ds2, it is possible to accurately measure a local temperature increase in a region where the sum of the heat generated by the power amplifier 11 and the heat generated by the power amplifier 12 becomes maximum. This in turn makes it possible to accurately measure a local peak temperature of the radio frequency module 1A even when the first transmission signal and the second transmission signal are transmitted simultaneously and thereby makes it possible to reduce the degradation of the performance of the power amplifiers 11 and 12 resulting from the increase in temperature.

Also, the radio frequency module 1A according to the first example is capable of simultaneously transmitting the first transmission signal and the second transmission signal and includes the module substrate 91; the power amplifier 11 that is disposed on or over the module substrate 91, amplifies a radio frequency signal, and outputs the amplified radio frequency signal as the first transmission signal; the power amplifier 12 that is disposed on or over the module substrate 91, amplifies a radio frequency signal, and outputs the amplified radio frequency signal as the second transmission signal; the temperature sensor 51 disposed on or over the module substrate 91; and the PA control circuit 50 that is disposed on or over the module substrate 91 and controls amplification operations of the power amplifiers 11 and 12 according to a measurement value of the temperature sensor 51. The distance Ds1 between the temperature sensor 51 and the power amplifier 11 is less than or equal to the distance Dpp between the power amplifier 11 and the power amplifier 12; and the distance Ds2 between the temperature sensor 51 and the power amplifier 12 is less than or equal to the distance Dpp.

With the above configuration, because the temperature sensor 51 is disposed close to the power amplifiers 11 and 12 at distances less than or equal to the distance Dpp, the temperature sensor 51 can accurately measure a local temperature increase in a region close to the power amplifiers 11 and 12 where the sum of the heat generated by the power amplifier 11 and the heat generated by the power amplifier 12 becomes maximum. This in turn makes it possible to accurately measure a local peak temperature of the radio frequency module 1A even when the first transmission signal and the second transmission signal are transmitted simultaneously and thereby makes it possible to reduce the degradation of the performance of the power amplifiers 11 and 12 resulting from the increase in temperature.

In the radio frequency modules 1D, 1E, and 1F, the temperature sensor 51 and the PA control circuit 50 may be included in one semiconductor IC.

With this configuration, because the temperature sensor 51 and the PA control circuit 50 are formed as one semiconductor IC, the sizes of the radio frequency modules 1D, 1E, and 1F can be further reduced.

Also, in the radio frequency module 1E, the semiconductor IC 71 may be disposed above the major surface of the module substrate 91, the power amplifier 11 may be disposed between the major surface and the semiconductor IC 71, and the temperature sensor 51 and the power amplifier 11 may at least partially overlap each other in plan view of the major surface.

With this configuration, the distance Ds1 between the temperature sensor 51 and the power amplifier 11 becomes less than or equal to the distance Ds2 between the temperature sensor 51 and the power amplifier 12. This in turn makes it possible to accurately measure a local peak temperature of the radio frequency module 1E even when the first transmission signal and the second transmission signal are transmitted simultaneously and thereby makes it possible to reduce the degradation of the performance of the power amplifiers 11 and 12.

Also, in the radio frequency module 1E, the power amplifier 11 may include the amplification transistor Tr, and the temperature sensor 51 and the amplification transistor Tr1 may at least partially overlap each other in plan view of the major surface of the module substrate 91.

This configuration makes it possible to reduce the distance between the temperature sensor 51 and the power amplifier 11, particularly, between the temperature sensor 51 and the amplification transistor Tr1 that is the heat source of the power amplifier 11. This in turn makes it possible to more accurately measure a local peak temperature of the radio frequency module 1E even when the first transmission signal and the second transmission signal are transmitted simultaneously.

Also, in the radio frequency module 1E, an electrode formed on the top surface of the semiconductor IC 71 may be connected to an electrode formed on the top surface of the power amplifier 11 via the bonding wire 81.

This configuration eliminates the need to provide a region for forming an electrode on the major surface of the module substrate 91 and thereby makes it possible to reduce the size of the radio frequency module 1E.

Also, in the radio frequency module 1F, the module substrate 91 may include the major surfaces 91a and 91b that face each other, the power amplifiers 11 and 12 may be disposed on or over the major surface 91a, the semiconductor IC 72 may be disposed on or over the major surface 91b, and the temperature sensor 51 and the power amplifier 11 may at least partially overlap each other in plan view of the module substrate 91.

With this configuration, the distance Ds1 between the temperature sensor 51 and the power amplifier 11 becomes less than or equal to the distance Ds2 between the temperature sensor 51 and the power amplifier 12. This in turn makes it possible to accurately measure a local peak temperature of the radio frequency module 1F even when the first transmission signal and the second transmission signal are transmitted simultaneously and thereby makes it possible to reduce the degradation of the performance of the power amplifiers 11 and 12.

Also, in the radio frequency module 1F, the power amplifier 11 may include the amplification transistor Tr1, and the temperature sensor 51 and the amplification transistor Tr1 may at least partially overlap each other in plan view of the module substrate 91.

This configuration makes it possible to reduce the distance between the temperature sensor 51 and the power amplifier 11, particularly, between the temperature sensor 51 and the amplification transistor Tr1 that is the heat source of the power amplifier 11. This in turn makes it possible to more accurately measure a local peak temperature of the radio frequency module 1F even when the first transmission signal and the second transmission signal are transmitted simultaneously.

The radio frequency module 1F may further include the external connection terminals 150 disposed on or over the major surface 91b.

The radio frequency module 1F may further include the low-noise amplifiers 21 and 22 disposed on or over the major surface 91b.

With this configuration, because the power amplifiers 11 and 12 for amplifying transmission signals and the low-noise amplifiers 21 and 22 for amplifying reception signals are disposed on different sides of the module substrate 91, the isolation between transmission and reception is improved.

In the radio frequency module 1A, the temperature sensor 51 may be disposed between the power amplifier 11 and the power amplifier 12.

This configuration makes it possible to more accurately measure the local peak temperature of the radio frequency module 1A. Also, placing the temperature sensor 51 in the above-described position makes it possible to reduce the thermal interference between the power amplifier 11 and the power amplifier 12.

In the radio frequency module 1A, the power amplifier 11 may include the amplification transistor Tr1, the power amplifier 12 may include the amplification transistor Tr2, and the temperature sensor 51 may be disposed between the amplification transistor Tr1 and the amplification transistor Tr2.

In the region between the power amplifier 11 and the power amplifier 12, particularly the region between the amplification transistor Tr1 that is the heat source of the power amplifier 11 and the amplification transistor Tr2 that is the heat source of the power amplifier 12 is where the local peak temperature is observed when high-power transmission signals are transmitted simultaneously from the power amplifiers 11 and 12. Accordingly, the local peak temperature of the radio frequency module 1A can be measured more accurately.

Also, in the radio frequency module 1A, no other circuit component is disposed between the temperature sensor 51 and the power amplifier 11.

With this configuration, heat generated by the power amplifier 11 can be transferred to the temperature sensor 51 without necessarily being absorbed by other circuit components. Accordingly, the local peak temperature of the radio frequency module 1A can be measured more accurately.

The radio frequency module 1A may further include the transmission filter 61T that is connected to the output terminal of the power amplifier 11 and transmits the first transmission signal and the transmission filter 62T that is connected to the output terminal of the power amplifier 12 and transmits the second transmission signal; the distance Ds1 between the temperature sensor 51 and the power amplifier 11 may be less than the distance between the temperature sensor 51 and the transmission filter 61T; and the distance Ds2 between the temperature sensor 51 and the power amplifier 12 may be less than the distance between the temperature sensor 51 and the transmission filter 62T.

The transmission filters 61T and 62T transmit high-power transmission signals and are therefore circuit components that tend to generate heat. For this reason, the temperature sensor 51 is disposed closer to the power amplifier 11 than to the transmission filter 61T and the temperature sensor 51 is disposed closer to the power amplifier 12 than to the transmission filter 62T so that the local peak temperature resulting from heat generated by the power amplifiers 11 and 12 can be measured accurately.

The communication device 5 includes the RFIC 3 that processes a transmission signal to be transmitted via the antenna 2, and the radio frequency module 1 that transmits the transmission signal between the antenna 2 and the RFIC 3.

This makes it possible to provide the communication device 5 configured such that accurate temperature measurement can be performed even when multiple radio frequency signals are transmitted simultaneously and the performance degradation of power amplifiers can be reduced.

Other Embodiments

Radio frequency modules and a communication device according to the embodiment of the present disclosure are described above using examples and variations. However, the radio frequency modules and the communication device according to the present disclosure are not limited to those described in the embodiment, examples, and variations. Other embodiments implemented by combining components in the above embodiment, examples, and variations, other variations obtained by applying various modifications conceivable by a person skilled in the art to the above embodiment, examples, and variations without necessarily departing from the spirit of the present disclosure, and various devices including the radio frequency modules and the communication device described above are also included in the present disclosure.

For example, in the radio frequency modules and the communication device according to the above embodiment, examples, and variations, additional circuit elements and wires may be inserted in paths connecting circuit elements and signal paths illustrated in the drawings.

INDUSTRIAL APPLICABILITY

The present disclosure can be widely used for communication devices, such as a mobile phone, as a radio frequency module disposed in a multiband front-end unit.

REFERENCE SIGNS LIST 1, 1A, 1B, 1C, 1D, 1E, 1F radio frequency module
2 antenna

3 RF signal processing circuit (RFIC)
4 base band signal processing circuit (BBIC)
5 communication device
11, 12 power amplifier
21, 22 low-noise amplifier
31, 32, 33, 34, 35, 36 matching circuit
41 switch
50 PA control circuit
51 temperature sensor
61, 62 duplexer
61R, 62R reception filter
61T, 62T transmission filter
70, 71, 72 semiconductor IC
81, 82, 83 bonding wire
91 module substrate
91a, 91b major surface
92, 93 resin component
100 antenna connection terminal
111, 112 transmission input terminal
113 control signal terminal
121, 122 reception output terminal
150 external connection terminal
Dpp, Ds1, Ds2 distance
Tr1, Tr2 amplification transistor

The invention claimed is:

1. A radio frequency module configured to simultaneously transmit a first transmission signal and a second transmission signal, the radio frequency module comprising:
a module substrate;
a first power amplifier that is on or over the module substrate, and that is configured to amplify a first radio frequency signal and to output the amplified radio frequency signal as the first transmission signal;
a second power amplifier that is on or over the module substrate, and that is configured to amplify a second radio frequency signal and to output the amplified second radio frequency signal as the second transmission signal;
a temperature sensor on or over the module substrate; and
a control circuit that is on or over the module substrate, and that is configured to control amplification operations of the first power amplifier and the second power amplifier according to a measurement value of the temperature sensor,
wherein a maximum output power of the first power amplifier is greater than a maximum output power of the second power amplifier; and
a distance between the temperature sensor and the first power amplifier is less than or equal to a distance between the temperature sensor and the second power amplifier.

2. A radio frequency module configured to simultaneously transmit a first transmission signal and a second transmission signal, the radio frequency module comprising:
a module substrate;
a first power amplifier that is on or over the module substrate, and that is configured to amplify a first radio frequency signal and to output the amplified radio frequency signal as the first transmission signal;
a second power amplifier that is on or over the module substrate, and that is configured to amplify a second radio frequency signal and to output the amplified second radio frequency signal as the second transmission signal;
a temperature sensor on or over the module substrate; and
a control circuit that is on or over the module substrate, and that is configured to control amplification operations of the first power amplifier and the second power amplifier according to a measurement value of the temperature sensor,
wherein a distance between the temperature sensor and the first power amplifier is less than or equal to a distance between the first power amplifier and the second power amplifier; and
a distance between the temperature sensor and the second power amplifier is less than or equal to the distance between the first power amplifier and the second power amplifier.

3. The radio frequency module according to claim 1, wherein the temperature sensor and the control circuit are included in one semiconductor integrated circuit (IC).

4. The radio frequency module according to claim 2, wherein the temperature sensor and the control circuit are included in one semiconductor integrated circuit (IC).

5. The radio frequency module according to claim 3,
wherein the semiconductor IC is above a major surface of the module substrate;
wherein the first power amplifier is between the major surface and the semiconductor IC; and
wherein the temperature sensor and the first power amplifier at least partially overlap each other in a plan view of the major surface.

6. The radio frequency module according to claim 4,
wherein the semiconductor IC is above a major surface of the module substrate;
wherein the first power amplifier is between the major surface and the semiconductor IC; and
wherein the temperature sensor and the first power amplifier at least partially overlap each other in a plan view of the major surface.

7. The radio frequency module according to claim 5, wherein an electrode formed on a top surface of the semiconductor IC is connected to an electrode formed on a top surface of the first power amplifier via a bonding wire.

8. The radio frequency module according to claim 6, wherein an electrode formed on a top surface of the semiconductor IC is connected to an electrode formed on a top surface of the first power amplifier via a bonding wire.

9. The radio frequency module according to claim 3,
wherein the module substrate includes a first major surface and a second major surface that face each other;
wherein the first power amplifier and the second power amplifier are on or over the first major surface;
wherein the semiconductor IC is on or over the second major surface; and
wherein the temperature sensor and the first power amplifier at least partially overlap each other in a plan view of the module substrate.

10. The radio frequency module according to claim 4,
wherein the module substrate includes a first major surface and a second major surface that face each other;
wherein the first power amplifier and the second power amplifier are on or over the first major surface;
wherein the semiconductor IC is on or over the second major surface; and
wherein the temperature sensor and the first power amplifier at least partially overlap each other in a plan view of the module substrate.

11. The radio frequency module according to claim 9, further comprising:
a low-noise amplifier on or over the second major surface.

12. The radio frequency module according to claim 10, further comprising:
a low-noise amplifier on or over the second major surface.

13. The radio frequency module according to claim 1, wherein the temperature sensor is between the first power amplifier and the second power amplifier.

14. The radio frequency module according to claim 2, wherein the temperature sensor is between the first power amplifier and the second power amplifier.

15. The radio frequency module according to claim 13,
wherein the first power amplifier comprises a first amplification transistor;
wherein the second power amplifier comprises a second amplification transistor; and
the temperature sensor is between the first amplification transistor and the second amplification transistor.

16. The radio frequency module according to claim 14,
wherein the first power amplifier comprises a first amplification transistor;
wherein the second power amplifier comprises a second amplification transistor; and
the temperature sensor is between the first amplification transistor and the second amplification transistor.

17. The radio frequency module according to claim 1, wherein no other circuit component is between the temperature sensor and the first power amplifier.

18. The radio frequency module according to claim 2, wherein no other circuit component is between the temperature sensor and the first power amplifier.

19. The radio frequency module according to claim 1, further comprising:

a first filter that is connected to an output terminal of the first power amplifier and that is configured to transmit the first transmission signal; and
a second filter that is connected to an output terminal of the second power amplifier and that is configured to transmit the second transmission signal,
wherein the distance between the temperature sensor and the first power amplifier is less than a distance between the temperature sensor and the first filter, and
wherein the distance between the temperature sensor and the second power amplifier is less than a distance between the temperature sensor and the second filter.

20. The radio frequency module according to claim 2, further comprising:
a first filter that is connected to an output terminal of the first power amplifier and that is configured to transmit the first transmission signal; and
a second filter that is connected to an output terminal of the second power amplifier and that is configured to transmit the second transmission signal,
wherein the distance between the temperature sensor and the first power amplifier is less than a distance between the temperature sensor and the first filter, and
wherein the distance between the temperature sensor and the second power amplifier is less than a distance between the temperature sensor and the second filter.

* * * * *